(12) United States Patent
Guo et al.

(10) Patent No.: US 10,600,476 B2
(45) Date of Patent: Mar. 24, 2020

(54) ROW BASED MEMORY WRITE ASSIST AND ACTIVE SLEEP BIAS

(71) Applicant: Intel Corporation, Santa Clara, CA (US)

(72) Inventors: Zheng Guo, Portland, OR (US); Clifford L. Ong, Portland, OR (US); Eric A. Karl, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/909,284

(22) Filed: Mar. 1, 2018

(65) Prior Publication Data

US 2019/0272868 A1    Sep. 5, 2019

(51) Int. Cl.

| | |
|---|---|
| *G11C 5/14* | (2006.01) |
| *G11C 11/419* | (2006.01) |
| *G11C 7/12* | (2006.01) |
| *G11C 7/22* | (2006.01) |
| *G11C 5/06* | (2006.01) |
| *G11C 11/408* | (2006.01) |
| *G11C 5/02* | (2006.01) |
| *H01L 27/11* | (2006.01) |
| *G06F 17/50* | (2006.01) |

(52) U.S. Cl.
CPC .............. *G11C 11/419* (2013.01); *G11C 5/025* (2013.01); *G11C 5/066* (2013.01); *G11C 5/147* (2013.01); *G11C 5/148* (2013.01); *G11C 7/12* (2013.01); *G11C 7/222* (2013.01); *G11C 11/4087* (2013.01); *H01L 27/11* (2013.01); *G06F 17/5072* (2013.01); *G11C 2207/2227* (2013.01)

(58) Field of Classification Search
CPC ............ G11C 16/0458; G11C 16/0433; G11C 16/0466; G11C 16/10; G11C 16/14; G11C 16/26; G11C 16/3427; G11C 2211/5612; G11C 7/12; G11C 11/16; G11C 11/1653; G11C 11/1655; G11C 11/1673; G11C 11/1675
USPC ........... 365/185.05, 185.17, 51, 158, 185.18, 365/185.29, 66; 257/774, 737, E21.499, 257/E21.502, E23.01, 773, E23.011, 257/E23.068
See application file for complete search history.

(56) References Cited

U.S. PATENT DOCUMENTS

| | | | | |
|---|---|---|---|---|
| 2009/0321791 A1* | 12/2009 | Wagner | ............... | G06F 17/5068 257/207 |
| 2013/0264718 A1* | 10/2013 | Chang | ................ | H01L 27/1104 257/774 |

(Continued)

FOREIGN PATENT DOCUMENTS

WO    2018236377    12/2018

*Primary Examiner* — Thong Q Le
(74) *Attorney, Agent, or Firm* — Green, Howard & Mughal LLP

(57) ABSTRACT

An apparatus is provided which comprises: an interconnect comprising poly extending in a first direction; a power supply rail extending in a second direction, wherein the second direction is parallel to the first direction; and a memory array organized in rows and columns, wherein the rows are orthogonal to the columns, wherein the first and second directions are parallel to the rows of the memory array, wherein the memory array comprises bit-cells (e.g., 6T SRAM bit-cells) that are organized such that there are no gap bit-cells in the array.

20 Claims, 12 Drawing Sheets

(56) References Cited

U.S. PATENT DOCUMENTS

2015/0076575 A1* 3/2015 Wu ................... H01L 27/1116
  257/296
2015/0333008 A1* 11/2015 Gupta ................ H01L 27/0207
  257/369

* cited by examiner

ROW BASED MEMORY WRITE ASSIST AND ACTIVE SLEEP BIAS

BACKGROUND

The growth of battery-powered mobile and wearable devices has increased the importance of low power operation and cost in system-on-chip (SoC) design. Peripheral assist circuits that enhance process window for Static Random Access Memory (SRAM) operation at low voltage are an increasingly important area of focus for continued SRAM scaling in face of increasing process variability.

Transient voltage collapse (TVC) write assist circuits have been used to significantly enhance the operating voltage window for the highest density SRAM bit-cells. However, the most significant drawback of the TVC write assist scheme is the elevated active write power dissipation associated with the switching of the highly capacitive memory power supply, SRAMVCC supply, and discharging and charging back up high (or '1') bit-cell storage nodes of the entire memory sector under access (divided by the column multiplexer (CM) factor). Furthermore, the inability to power un-accessed portions of active memory arrays at the lowest retention voltage state further limits reduction in the leakage power dissipation of active SRAM macros (e.g., SRAM banks) in a design.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1A:
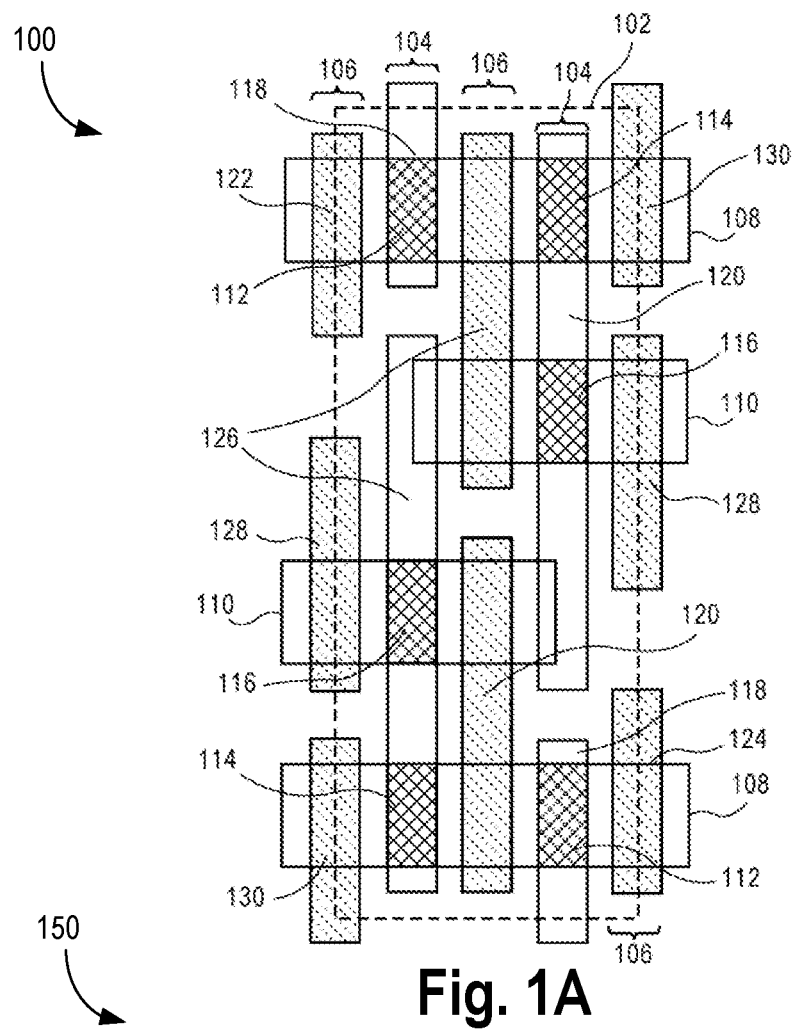
FIGS. 1A-B illustrate a bit-cell layout and a schematic diagram, respectively, for a conventional six transistor (6T) static random access memory (SRAM).

Recently, tall bit-cell layout topology is used to deliver the most dense bit-cell layouts while also eliminating poly jogs. In this topology, the SRAMVCC node of adjacent bit-cells in a column of bit-cells is shared. Such tall-bit-cell layout topologies merely allow for column based TVC write assist schemes where an entire accessed sector must be switched during each write access. This results in a significant amount of total capacitance (e.g., combination of interconnect and device capacitance tied to the SRAMVCC and the '1' bit-cell storage nodes) being switched by approximately half of power supply swing (e.g., VCC swing) each active write operation.

In column based sleep bias, an entire memory sector needs to be powered by the VCC of the memory bank for each row access. In addition, because SRAMVCC of the entire sector needs to be activated for each operation, certain memory blocks with high activity factors may never be put in retention state due to the slow wakeup-up times (e.g., the wake-up current may be prohibitively high) and this further increases leakage power dissipation.

In some embodiments, a new SRAM bit-cell topology is described that results in more compact bit-cell layout than the tall bit-cell layout technology. With this new bit-cell topology, (also referred to as the uniform bit-cell topology) the SRAMVCC node (or supply rail) can be isolated between adjacent bit-cells in a same direction without placement of dummy cells (also referred to as gap cells). As such, a single bit-cell access (either read or write) will select one row at a time which allows the TVC write assist to apply to the accessed row. For example, SRAMVCC can now be routed in the direction of SRAM row instead of SRAM column allowing for local sleep of bit-cells with faster wake-up times since entire SRAM sub-arrays do not need to be put to sleep.

With row based TVC write assist scheme, merely the accessed row group (divided by the column mux, or CM factor) is switched during each write access, resulting a significantly reduced capacitance switching. For example, capacitance switching can reduce by a factor close to M/N, where 'M' is the number of rows per subarray sector and 'N' is the number of rows in each row group. In the case of an SRAM array with 256 bits per memory sector, the factor of reduction in capacitance switching is nearly 32× for row based implementation with 8 rows per group.

In some embodiments, when column interleaving is applied, then the write assist can be applied to the active columns along the row to avoid half-select disturbance. With row based write assist and active sleep bias, merely memory cells in each row group can be activated for each operation. In addition, all un-accessed rows in the active SRAM array can be powered down to the retention voltage (Vccmin) for active leakage reduction. Further, due to the locality of the SRAMVCC connection, with various embodiments it is now possible to wake-up each row group for the same cycle access with minimal impact to cycle time due to much reduced wake-up current, thus, enabling arrays with high activity factors to also be put in retention state to further minimize leakage power dissipation.

As such, finer granularity of sleep is achieved for the SRAM array because SRAM cells can be put to sleep without putting an entire SRAM sub-array to sleep. Due to the smaller bit-cell pitch along the row direction, the area overhead of implementing single row TVC and sleep-bias may be too significant. Therefore, TVC and sleep-bias can be applied to a group of rows for best power-area tradeoff. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

Figure 1B:
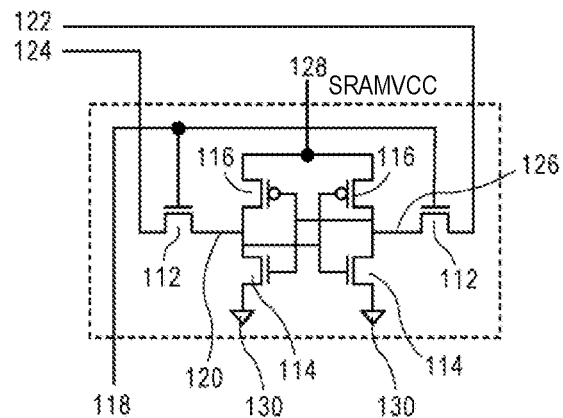

FIGS. 1A-B illustrate a bit-cell layout 100 and a corresponding schematic diagram 150, respectively, for a conventional six transistor (6T) static random access memory (SRAM). In conventional 6T SRAM bit cell layouts, the patterns created by trench contact plug formation, gate line plug formation, and fin trim are non-uniform. Such non-uniformity may not be compatible with advanced self-aligned process technology which may require uniform plug and mask patterns for such base layers. To accommodate conventional 6T SRAM layout under a given set of design rules, the corresponding bit-cell would likely have change significantly. For example, the corresponding bit-cell may have to incur significant growth in terms of area, or alternatively, significant process risks may need to be taken by breaking uniform plug/mask pattern requirements.

Here, bit-cell area 102 includes gate lines 104 (which may also be referred to as poly lines), and trench contact lines 106 alternate with the gate lines 104. The gate lines 104 and trench contact lines 106 are over NMOS diffusion regions 108 (e.g., p-type doped active regions, such as boron doped diffusion regions of an underlying substrate) and PMOS diffusion regions 110 (e.g., n-type doped active regions, such as phosphorous and/or arsenic doped diffusion regions of an underlying substrate). In the example of FIG. 1A, each of the NMOS diffusion regions 108 and the PMOS diffusion regions 110 has the same gate width which may be, e.g., a single semiconductor fin. Access transistors 112, N-type cell transistors 114, and P-type cell transistors 116 are formed from the gate lines 104 and the NMOS diffusion regions 108 and the PMOS diffusion regions 110. Also depicted are a wordline (WL) 118, a bit bar (BB) 120, a bit line (BL) 122, a bit line bar (BLB) 124, internal node storage (BT) 126, SRAM VCC 128, and VSS 130.

Figure 2A:
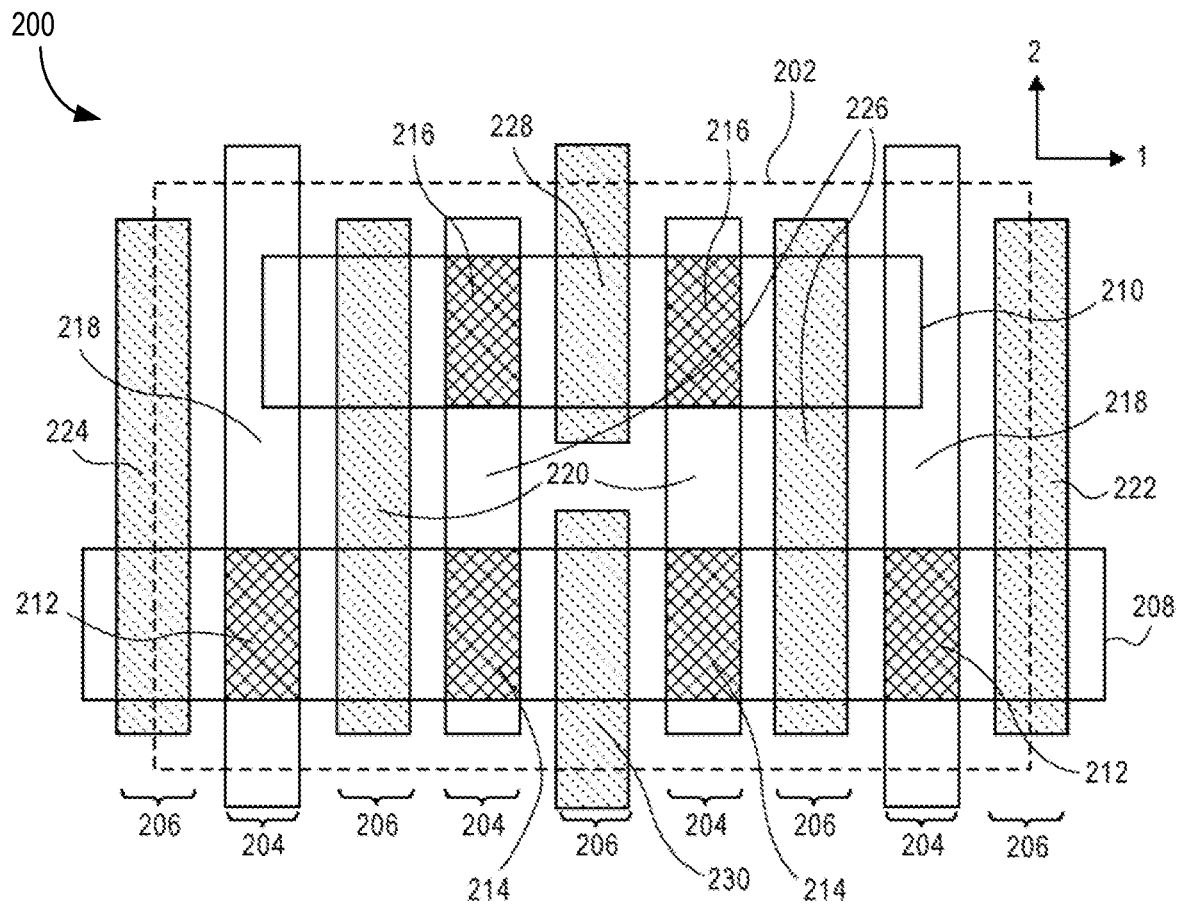
FIGS. 2A-B illustrate a bit-cell layout and a schematic diagram, respectively, for a uniform 6T SRAM, in accordance with some embodiments of the disclosure.
Figure 2B:
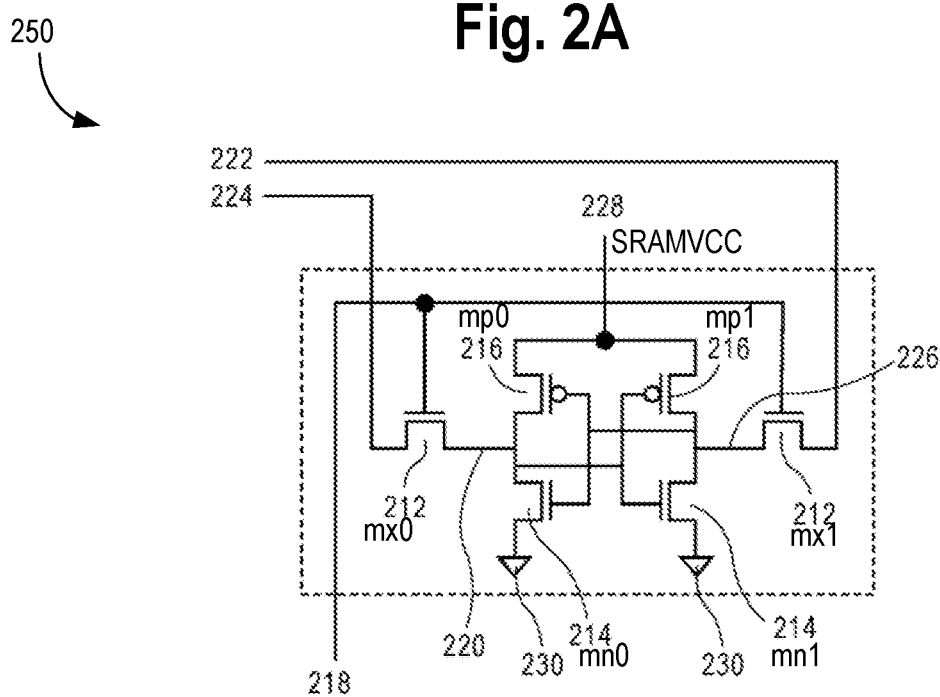

FIGS. 2A-B illustrate a bit cell layout 200 and a schematic diagram 250, respectively, for a uniform 6T SRAM, in accordance with some embodiments. Here, a bit cell area 202 includes gate lines 204 (which may also be referred to as poly lines), and trench contact lines 206 which alternate with the gate lines 204. In some embodiments, the gate lines 204 and trench contact lines 206 are over a single NMOS diffusion regions 208 (e.g., a p-type doped active region, such as a boron doped diffusion region of an underlying substrate) and a single PMOS diffusion regions 210 (e.g., an n-type doped active region, such as a phosphorous and/or arsenic doped diffusion region of an underlying substrate). In some embodiments, the NMOS diffusion region 208 and the PMOS diffusion region 210 has the same gate width which may be, e.g., a single semiconductor fin. Access transistors 212, n-type cell transistors 214, and p-type cell transistors 216 are formed from the gate lines 204 and the NMOS diffusion region 208 and the PMOS diffusion region 210. Also depicted are a wordline (WL) 218, a bit bar (BB) 220, a bit line (BL) 222, a bit line bar (BLB) 224, internal node storage (BT) 226, SRAM VCC 228, and VSS 230.

The layout of FIG. 2A is, in some embodiments, referred to as uniform mask SRAM. In such a uniform mask 6T SRAM, one inverter-pass gate pair is rotated and flipped so as to abut with the other inverter-pass gate pair. In some embodiments, the VCC and VSS terminals of the inverter are shared with the other inverter. In contrast to the four diffusion regions of FIG. 1A, merely two diffusion regions are included in the layout of FIG. 2A. Additionally, in contrast to the two gate lines 104 of FIG. 1A, four gate lines 204 are used in the layout of FIG. 2A, in accordance with some embodiments.

Here, the four gate lines 204 may be referred to as being on tracks to form a grating structure. In some embodiments, the term "grating" for gate lines is used to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. In some embodiments, the original pitch may be quartered by a second round of spacer mask patterning. Accordingly, the grating-like patterns described here may have gate lines spaced at a constant pitch and having a constant width. In some embodiments, the pattern may be fabricated by a pitch halving or pitch quartering, or other pitch division, approach.

Referring more generally to FIG. 2A, in accordance with some embodiments, an integrated circuit (IC) structure includes a 6T SRAM bit cell 202 on a substrate. The 6T SRAM bit cell 202 includes first 210 and second 208 active regions parallel along a first direction (1) of the substrate. First, second, third and fourth gate lines 204 are over the first 210 and second 208 active regions. The first, second, third and fourth gate lines 204 are parallel along a second direction (2) of the substrate, the second direction (2) perpendicular to the first direction (1).

In some embodiments, the first active region 210 is an n-type doped active region, and the second active region 208 is a p-type doped active region. In some embodiments, the first 210 and second 208 active regions are in first and second silicon fins, respectively. In some embodiments, all individual ones of the first, second, third and fourth gate lines 204 are continuous between the first 210 and second 208 active regions, as is depicted in FIG. 2A. In some embodiments, the 6T SRAM bit-cell 202 has a length along the first direction (1) and a length along the second direction (2), and the first length is greater than the second length, as is also depicted in FIG. 2A. In some embodiments, individual ones of the first, second, third and fourth gate lines 204 are spaced apart from one another by trench contact lines 206 parallel along the second direction (2) of the substrate, as is also depicted in FIG. 2A.

Figure 3:
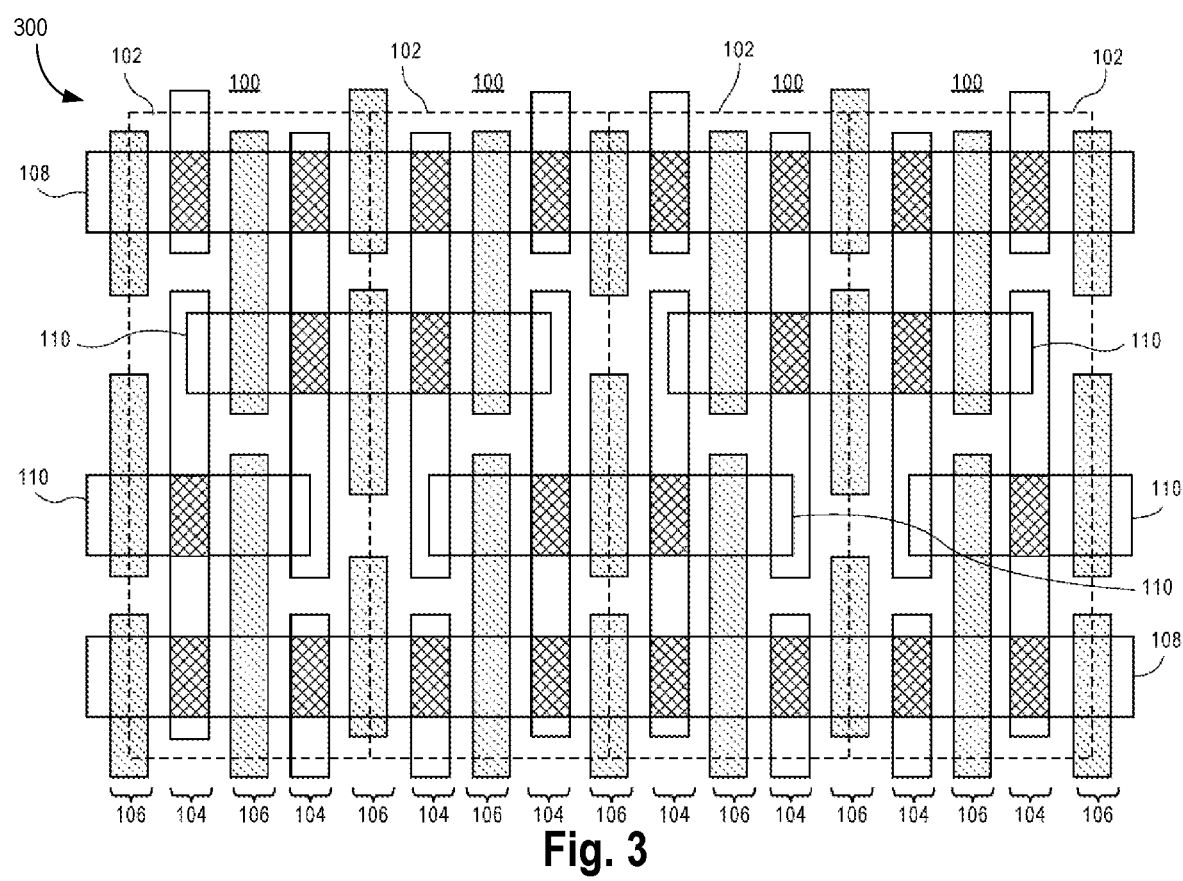
FIG. 3 illustrates a layout of four bit-cells of the conventional 6T SRAM.
Figure 4:
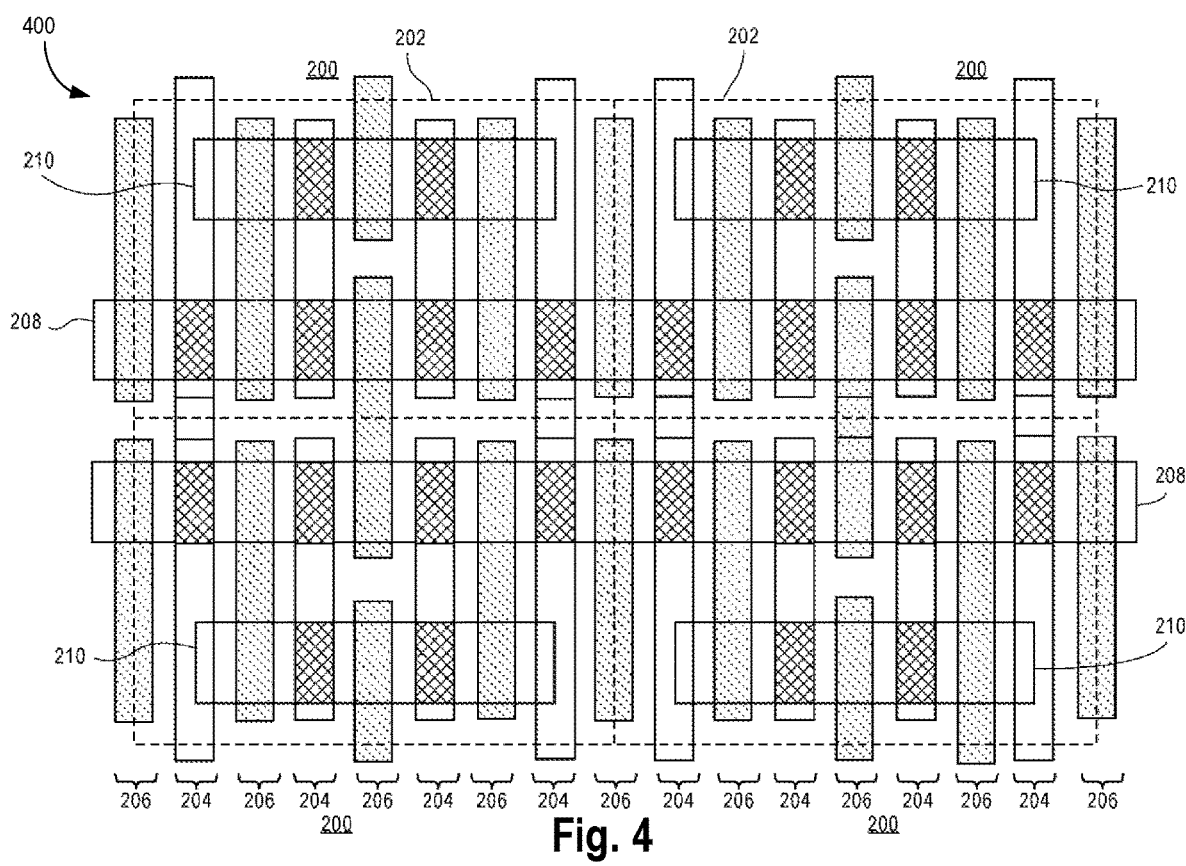
FIG. 4 illustrates a layout of four bit-cells of the uniform 6T SRAM, in accordance with some embodiments.

FIG. 3 illustrates a layout 300 of four bit-cells of the conventions 6T SRAM. FIG. 4 illustrates a layout 400 of four bit-cells of the 6T SRAM, in accordance with some embodiments. Here, four layouts of the type 100 are shown as neighboring bit cell areas 102. Gate lines 104 alternate with trench contact lines 106. The gate lines 104 and trench contact lines 106 are over NMOS diffusion regions 108 and PMOS diffusion regions 110. In layer 400, four layouts of the type 200 are shown as neighboring bit cell areas 202. Gate lines 204 alternate with trench contact lines 206. The gate lines 204 and trench contact lines 206 are over NMOS diffusion regions 208 and PMOS diffusion regions 210.

In some embodiments, with this new bit-cell topology 200, the SRAMVCC node (or supply rail) can be isolated between adjacent bit-cells in a same direction without placement of dummy cells. As such, a single bit-cell access (either read or write) will merely select one row at a time which allows the TVC write assist to merely apply to the accessed row. For example, SRAMVCC can now be routed in the direction of SRAM row instead of SRAM column allowing for local sleep of bit-cells with faster wake-up times since entire SRAM sub-arrays do not need to be put to sleep.

With row based write assist and active sleep bias, merely memory cells in each row group can be activated for each operation. In addition, all un-accessed rows in the active SRAM array can be powered down to the retention voltage (Vccmin) for active leakage reduction. Further, due to the locality of the SRAMVCC connection, with various embodiments it is now possible to wake-up each row group for the same cycle access with minimal impact to cycle time due to much reduced wake-up current, thus, enabling arrays with high activity factors to also be put in retention state to further minimize leakage power dissipation.

As such, finer granularity of sleep is achieved for the SRAM array because SRAM cells can be put to sleep without putting an entire SRAM sub-array to sleep. Due to the smaller bit-cell pitch along the row direction, the area overhead of implementing single row TVC and sleep-bias may be too significant. Therefore, TVC and sleep-bias can be applied to a group of rows for best power-area tradeoff.

Figure 5:
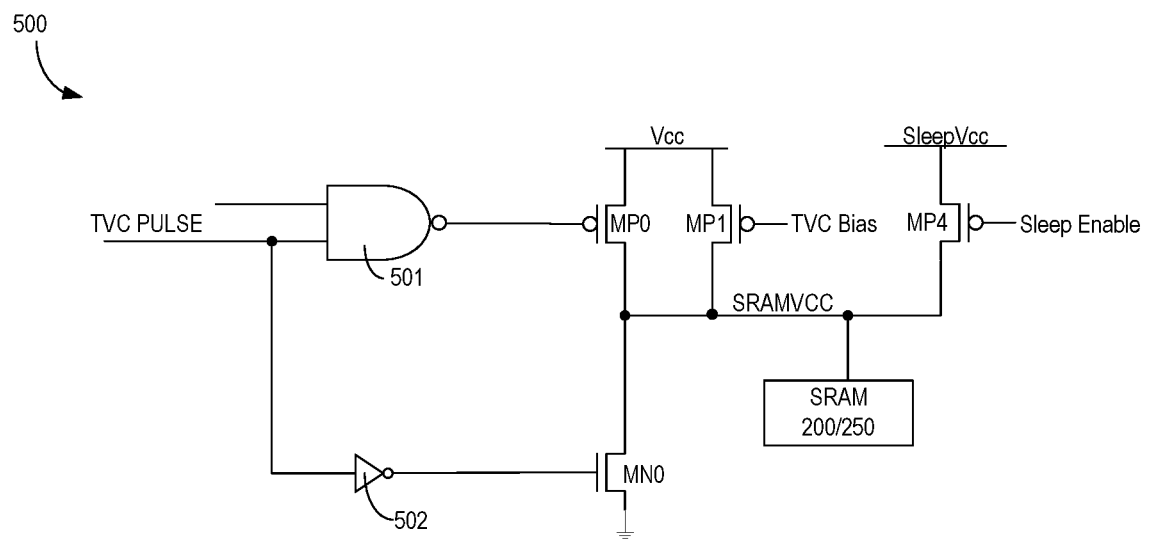
FIG. 5 illustrates a transient voltage collapse (TVC) write assist circuitry, in accordance with some embodiments.

FIG. 5 illustrates a transient voltage collapse (TVC) write assist circuitry 500, in accordance with some embodiments. In some embodiments, TVC circuitry 500 comprises p-type transistors MP0 and MP1 coupled to a first supply rail (e.g., an ungated power supply rail Vcc) and a second supply rail SRAMVCC. SRAMVCC is provided as power supply to a row or a group of rows in a memory array. In various embodiments, the second supply rail SRAMVCC extends in a direction which is the direction of rows of bit-cells in the memory array, where rows of bit-cells extend in a direction which is orthogonal (e.g., perpendicular) to the direction of columns of bit-cells. For example, when rows of bit-cells extend along the y-direction, then SRAMVCC also extends along the y-direction. Traditionally, SRAMVCC extends in a direction perpendicular to the direction of rows of the bit-cells. The uniform layout of the SRAM bit-cell as discussed with reference to FIG. 2 and FIG. 4 allow the SRAMVCC to be routed in the direction of the rows. As such SRAMVCC supply rail (or node) can be isolated between adjacent bit-cells in the same column, and this allows for granular control of sleep of SRAM bit-cells, and also allows for granular control of write assist of row(s) of bit-cells.

For example, when power supply to rows of SRAM bit-cells can be controlled then entire SRAM memory sub-arrays do not have to go to sleep state when merely a subset of SRAM bit-cells are desired to go to sleep state. In another example, when power supply to rows of SRAM bit-cells can be controlled then entire SRAM memory sub-arrays does not have to experience write assist voltage collapse when merely a subset of SRAM bit-cells are being written to. As such, granular level (or local level) of sleep and write assist is provided which results in faster wake-up times (e.g., faster to wake-up a few bit-cells from sleep mode than to wake-up a sector or an entire array of bit-cells) and less noise contamination from write assist to other bit-cells that are not being written to.

In some embodiments, TVC circuitry 500 comprises an n-type transistor MN0 which is coupled to the second supply rail SRAMVCC and also coupled in series with p-type transistor MP0. In some embodiments, transistor MP1 is controllable by TVC bias, which is a bias voltage generated by any suitable bias circuitry (e.g., programmable resistor ladder or voltage divider, bandgap circuit, etc.) in write assist mode (e.g., voltage collapse). In some embodiments, transistor MP4 is controllable by Sleep Enable, which sets the power supply level on SRAMVCC when the SRAM (e.g., 200/250) is set to go to low power mode (e.g., sleep mode). In some embodiments, a pulse (TVC PULSE) is provided that controls transistors MP0 and MN0 during a write operation so that SRAMVCC is lowered (or collapsed) for faster/efficient writing of data into the SRAM bit-cell. The pulse width of TVC PULSE is proportional to the duration of write operation and is long enough to write data to the SRAM bit-cell. In some embodiments, the TVC PULSE is received by logic 501 (e.g., NAND gate) which allows application of the write assist for a selected row or column of the memory array. In one such example, the second input to the logic gate 501 is a column select (COLSEL) or a row (or a group of rows) select signal. For proper logic operation of TVC circuitry 500, inverter 502 is provided to control the gate terminal of transistor MN0.

Since a single bit-cell access (either read or write) may merely select one row at a time, the TVC write assist may be applied to the accessed row. In one example, if column interleaving is applied, then the write assist is applied to the active columns along the row to avoid half-select disturbance. Further, all un-accessed rows in the active array can be powered down to the retention voltage for active leakage reduction, in accordance with some embodiments. Due to the smaller bit-cell pitch achieved by the uniform bit-cell layout of the various embodiments, the area and power overhead of implementing a single row TVC circuitry and sleep-bias can be traded-off for a group of rows. While it is possible with various embodiments to use smaller lower power TVC write assist circuitries for individual rows, fewer number of TVC write assist circuitries can be used by grouping rows (e.g., 8, 16, or 32 rows in a group).

Figure 6:
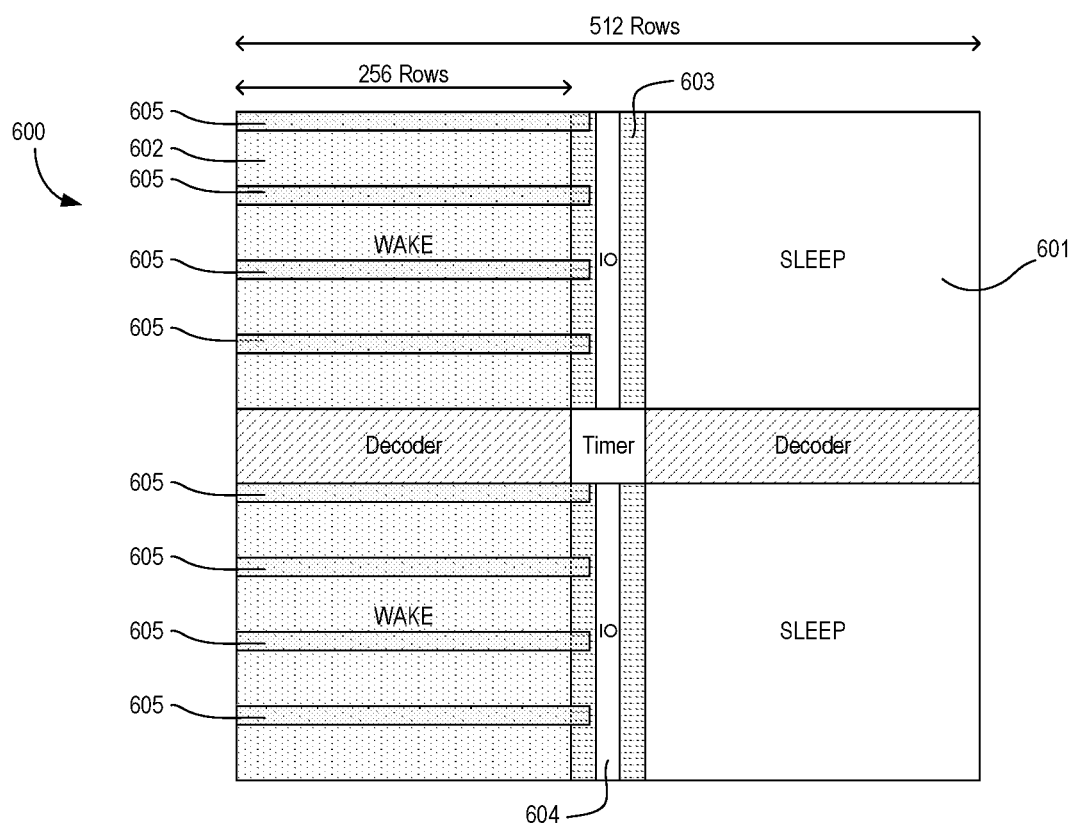
FIG. 6 illustrates a conventional SRAM array with an application of TVC write assist circuitry.

FIG. 6 illustrates a conventional SRAM array 600 with the application of TVC write assist circuitry to a conventional SRAM array. In this example, the memory array is divided into sectors 601 and 602, where the sectors of the memory arrays share column/row decoders, and timer.

In some embodiments, the timer comprises the majority of the control logic needed by the SRAM such as clock generation, address latches and predecoding, sense amp control logic, TVC control logic and pulse generator, etc. Each sector of the memory array comprises rows and columns of bit-cells. In this example, each sector has 256 rows and the memory array has 512 rows. In the conventional SRAM array architecture (e.g., with butterfly SRAM subarrays) that uses "tall" SRAM bit-cell layout, SRAM-VCC is routed in the direction of columns. The TVC write assist circuitry (e.g., 603) for each column resides in the IO (e.g., 604). As such, to provide write assist to some bit-cells in the selected columns (e.g., 605), one sector of the array has to be active and awake as shown by reference sign 602, while the other sector is put to sleep (e.g., 601).

Figure 7:
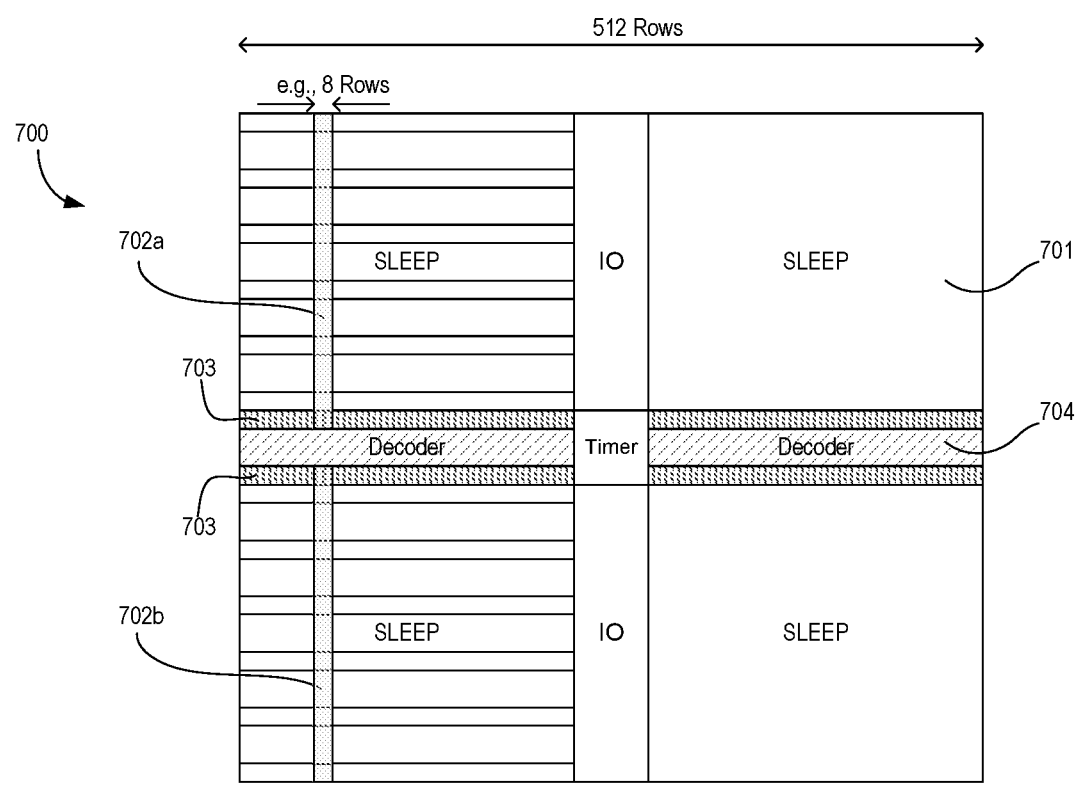
FIG. 7 illustrates a uniform SRAM array with an application of TVC write assist circuitry to the uniform SRAM array with row based SRAMVCC routing, in accordance with some embodiments.

FIG. 7 illustrates a uniform SRAM array architecture 700 with the application of TVC write assist circuitry to the uniform SRAM array with row based SRAMVCC routing, in accordance with some embodiments. With row based TVC write assist and active sleep bias scheme of various embodiments, the SRAMVCC node on N/CM bit-cells (where N is the number of rows in each row group and CM is the column multiplexer factor) will be switched during each write access. The TVC write assist circuitry (e.g., 703) for each column resides in the Decoder (e.g., 704). As such, merely N rows of bit-cells are powered to VCC of the memory bank. In this example, a group of rows (e.g., 8 rows in a group) can be provided with write assist (e.g., the shaded rows 702a and 702b in the top and bottom parts of one sector) while the rest of the sub-array and bit-cells are left in sleep state 701. In various embodiments, since the gap cells are no longer used due to the uniform SRAM bit-cell layout, the uniform SRAM array architecture 700 is smaller in area than the conventional SRAM array architecture 600. In the conventional SRAM, the TVC write assist circuit (e.g., 603) resides in the IO (e.g., 604), while in the row based TVC, the TVC write assist circuit (e.g., 703) resides in the Decoder (e.g., 704), in accordance with some embodiments.

With row based TVC, the power overhead of switching the SRAMVCC supply node and the bit-cell '1' storage nodes can be minimized (e.g., reduced) by a factor close to M/N, where M is the number of rows per subarray sector and N is the number of rows in each row group. For example, for a 256 rows per sector array, the total switched capacitance factor is nearly 32× for row based implementations with 8 rows per group. In addition, due to the locality of the SRAMVCC supply distribution, active local sleep can be applied to power down all un-accessed row group to the retention voltage (e.g., Vmin) to minimize (or reduce) active leakage power dissipation by a similar factor as described above. Here, retention voltage (Vmin) is the minimum supply voltage that is needed to keep the data stored in the memory cell. When supply voltage falls below this retention voltage, the data in the memory cell may be corrupted (e.g., lost). One rule that can be used in designing such an architecture is that each row group can be awaken without significant impact to the cycle time, which can be an area versus leakage saving and wake-up performance trade-off. In some embodiments, the TVC write assist circuitry is implemented in the row decoder region.

Table 1 summarizes the approximate total switched capacitance for a single IP associated with SRAMVCC collapse for the conventional column based TVC and the row based TVC scheme of some embodiments. Here, a 256 row/sector and 8 row/group butterfly SRAM subarray configuration is assumed.

TABLE 1

| Device | Capacitance per bit fF/bit | 256 b/bl, 8 rows/group | Column based capacitance (fF) | Row based capacitance (fF) |
|---|---|---|---|---|
| SRAMVCC node Capacitance | 0.046 | Device | 67.1 | 2.1 |
| '1' storage node capacitance | 0.27 | Interconnect | 17.9 | 1.0 |
| Percentage SRAMVCC swing | 0.8 | Total | 85.0 | 3.0 |
| Total capacitance per bit | 0.262 | Percentage of Column based | 100% | 4% |

The total device capacitance switched per bit-cell during each voltage collapse is the sum of the device capacitance directly connected to the SRAMVCC node (e.g., Vgs and capacitance Csb of mp0 and mp1) plus the device capacitance at the '1' storage node (e.g., capacitance Cg of mp0/mn1, and capacitance Cgd plus capacitance Cdb of transistors mp1/mn1/mx1) multiplied by the percentage of voltage collapse transferred to the '1' node (which in this example is assumed to be 80%), where Csb is the capacitance between the source and bulk region, Vgs is the voltage between the gate and the source regions, Cgd is the capacitance between the gate and the drain regions, Cdb is the capacitance between the drain and the bulk regions, and Cg is the gate capacitance.

The capacitance at the '1' storage node actually accounts for most of the device capacitance being switched during each transient voltage collapse. The total interconnect capacitance switched depends on the metal stack of the connections on the column versus row based TVC. In this example, column based SRAMVCC is distributed across the memory array in the x-direction on metal layer 2 (M2) and metal layer 4 (M4) with metal layer 3 (M3) straps, and row based SRAMVCC is distributed across the array in the y-direction on metal layer 5 (M5). The total amount of switched capacitance is approximately decreased by (1−N/M)*100%, where 'M' is 256 and 'N' is 8.

By optimizing the layout of the TVC circuitry, the row based TVC implementation can be done with minimal area overhead, in accordance with some embodiments.

Table 2 below shows that 8-bit row group implementation of row based TVC can be done with less than 1% area overhead, for example.

TABLE 2

| 8-bit RBA | Estimated Area Cost | | | |
|---|---|---|---|---|
| | Baseline | RBA | Δ | |
| X (pp) | 1240 | 1208 | −32 | −2.6% |
| Y (dg) | 2976 | 3072 | 96 | 3.2% |
| Area (μm²) | 4981.824 | 5009.818 | 27.99 | 0.6% |

| 16-bit | Lower Bound | | | |
|---|---|---|---|---|
| | Baseline | RBA | Δ | |
| X (pp) | 1240 | 1208 | −32 | 2.6% |
| Y (dg) | 2976 | 3040 | 64 | 2.2% |
| Area (μm²) | 4981.824 | 4957.632 | −24.19 | −0.5% |

| 32-bit | Upper Bound | | | |
|---|---|---|---|---|
| | Baseline | RBA | Δ | |
| X (pp) | 1240 | 1208 | −32 | 2.6% |
| Y (dg) | 2976 | 3040 | 64 | 2.2% |
| Area (μm²) | 4981.824 | 4957.632 | −24.19 | −0.5% |

Compared to the conventional SRAM with TVC write assist where the TVC write assist circuitry resides in the IO portion of the memory array, in the row based assist TVC of various embodiments, the TVC write assist circuit resides in the Decoder. As such, in the row based TVC, the area of the IO portion of the array decreases while the Decoder area increases. Table 2 shows an example where an SRAM array with 8-bit row based TVC has a net area increase of 0.6% compared to the conventional SRAM with TVC write assist. However, in one example, if the size of each row group were increased to 16-bit rows or 32-bit rows, the area actually decreases by 0.5% as compared to the conventional SRAM with TVC write assist.

While row based TVC can significantly reduce the overall capacitance being switched during each voltage collapse, it does not significantly reduce the total capacitance driven by each TVC circuit, since it limits the number of active TVC bias cells to 1, compared to the number of active IOs (input-output) in the column TVC scheme. The total capacitance driven by each TVC bias cell is the bit-cell number per row divided by the CM factor and multiplied by the number of rows per group.

Figure 8:
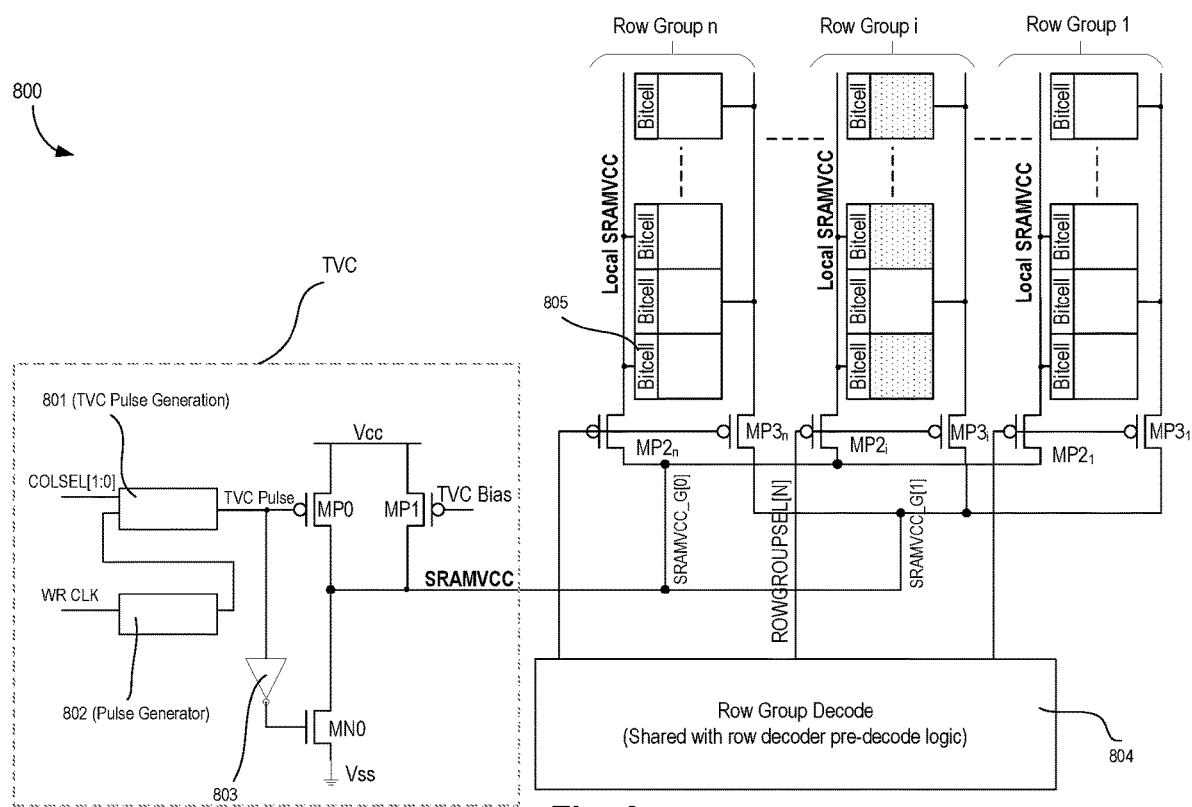
FIG. 8 illustrates a memory system where SRAMVCC signals are generated by write clock and column select signals, and local SRAMVCC power signals are driven to a memory row group through a multiplexer that is controlled by a row decoding logic that can be shared with a row decoder, in accordance with some embodiments.

FIG. 8 illustrates a memory system 800 where SRAM-VCC signals are generated by write clock and column select signals, and local SRAMVCC power signals are driven to a memory row group through a multiplexer that is controlled by a row decoding logic that can be shared with a row decoder, in accordance with some embodiments.

Memory system 800 illustrates the TVC circuitry including TVC pulse generation logic 801, pulse generator 802, inverter 803, other devices as discussed with reference to FIG. 5; Row Group Decoder 804, multiplexer (e.g., comprising transistors MP2$_{1-n}$, MP3$_{1-n}$); and column multiplexer factor of 2 (CM2) array having rows of bit-cells 805.

In some embodiments, one way to significantly reduce the capacitance driven by each TVC bias cell in the row based TVC scheme is to use an additional multiplexer stage (e.g., comprising transistors MP2$_{1-n}$, MP3$_{1-n}$) to pass the SRAM-VCC to the active row group. Here, the active group is Row Group i with shaded bit-cells. In memory system 800, global SRAMVCC signals (SRAMVCC_G[1:0]) are generated by the write clock (WR CLK) and column select signals (COLSEL[1:0]), and the local SRAMVCC signals are driven to the row group through a multiplexer that is controlled by the Row Group Decoding logic 804 that can be shared with the row decoder. This can significantly reduce the area overhead of the row based TVC, whose layout can be distributed across the entire sector. For example, when larger TVC bias cells are used to improve write assist performance, the reduction in area overhead becomes more desirable.

Figure 9:
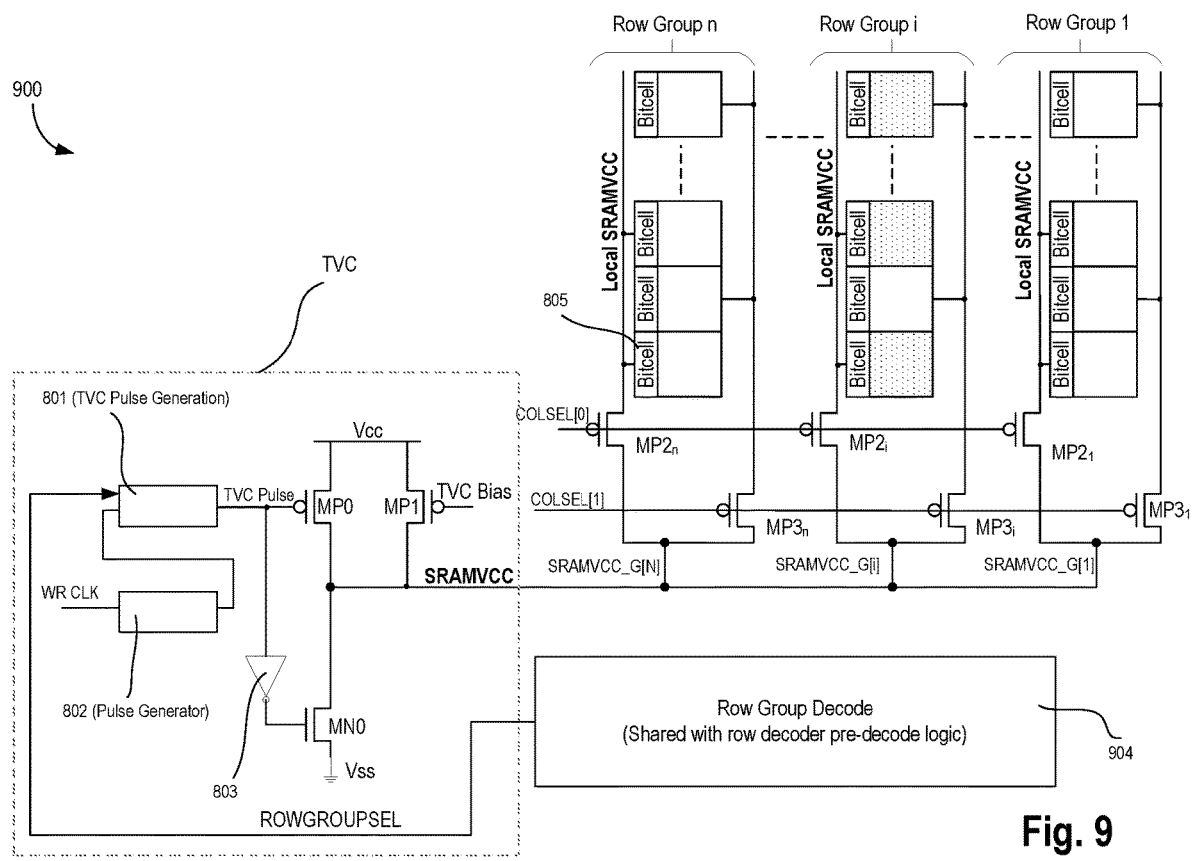
FIG. 9 illustrates a memory system with row based TVC with shared TVC bias logic across each local row group, wherein global SRAMVCC power signals are generated by write clock and row group select signals, and local SRAMVCC power signals are driven to accessed columns through a multiplexer that is controlled by column select signals, in accordance with some embodiments.

FIG. 9 illustrates memory system 900 with row based TVC with shared TVC bias logic across each local row group, according to some embodiments. Memory system 900 illustrates the TVC circuitry including TVC pulse generation logic 801, pulse generator 802, inverter 803, other devices as discussed with reference to FIG. 5; Row Group Decoder 904, multiplexer (e.g., comprising transistors MP2$_{1-n}$, MP3$_{1-n}$); and column multiplexer factor of 2 (CM2) array having rows of bit-cells 805. In some embodiments, the Row Group Decoder logic 904 for the row group select signals is shared with the row decoder. Here, the global SRAMVCC power signals (SRAMVCC_G[1:0]) are generated by write clock (WR CLK) and row group select signals (ROWGROUPSEL), and local SRAMVCC power signals are driven to accessed columns through the multiplexer that is controlled by column select signal (COLSEL [0] and COLSEL[1]), in accordance with some embodiments.

Figure 10:
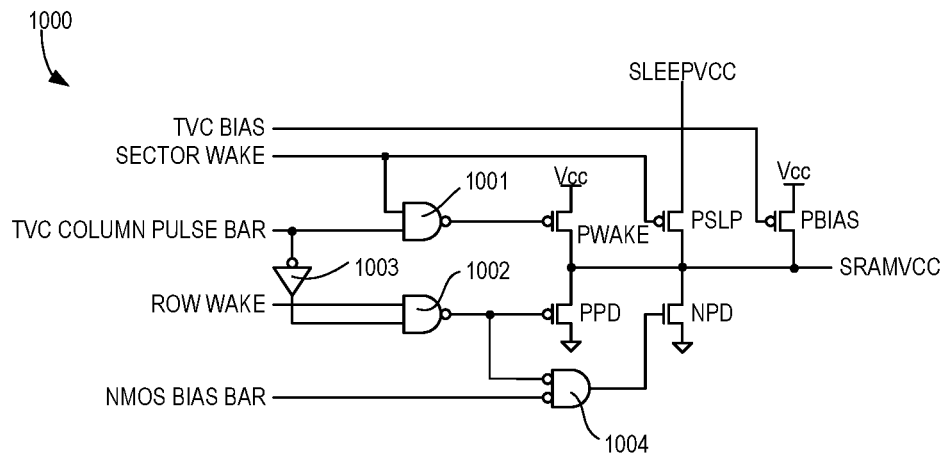
FIG. 10 illustrates circuitry of the row based TVC circuit without using a multiplexer as described in FIG. 8 and FIG. 9, in accordance with some embodiments.

FIG. 10 illustrates an embodiment (or circuitry) 1000 of the row based TVC circuit without using a multiplexer as described in FIG. 8 and FIG. 9. Circuitry 1000 comprises NAND logic gates 1001 and 1002, inverter 1003, AND gate 1004 with inverted inputs, p-type transistors PWAKE, PPD, PSLP, and PBIAS, and n-type transistor NPD coupled together as shown. In some embodiments, the SRAMVCC for each row group and selected column is supplied by the circuitry 1000. In this circuit, merely the selected row group receives the ROW WAKE signal and merely the selected column receive the TVC COLUMN PULSE BAR signal. As such, in some embodiments, write assist is delivered on the SRAMVCC of the selected row group and selected column through the PMOS pulldown device (PPD) or NMOS pulldown device (NPD) depending on whether the NMOS BIAS BAR is selected. Similar to FIG. 8 and FIG. 9, in some embodiments, the TVC Bias is supplied using PMOS device PBIAS. In some embodiments, the SRAM bit-cells are awaken through the PMOS wake device (PWAKE) when SECTOR WAKE is activated, and put to sleep through the PMOS sleep device (PSLP) when SECTOR WAKE is not active.

Figure 11:
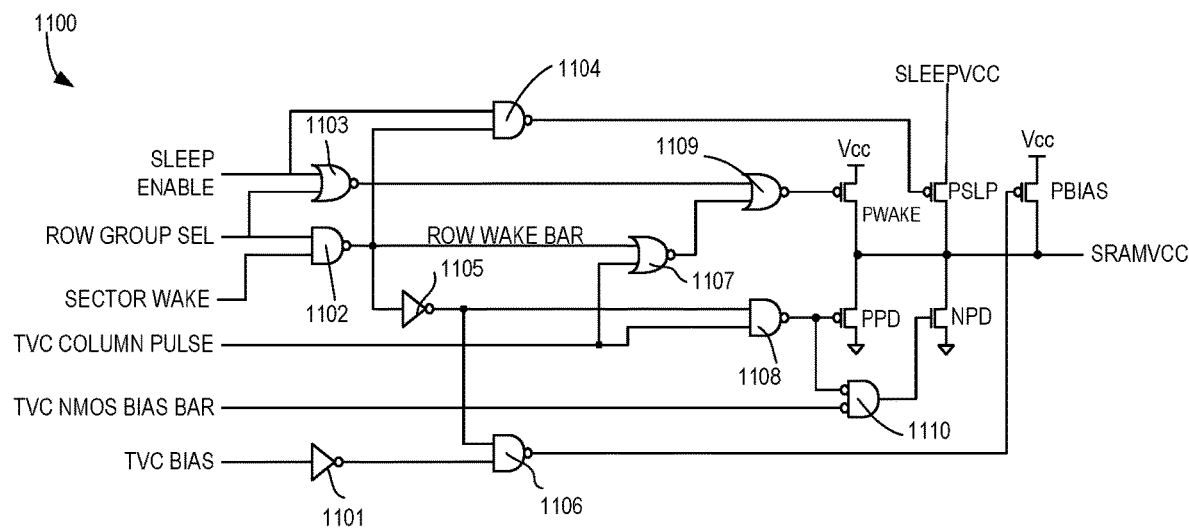
FIG. 11 illustrates circuitry of the row based TVC circuit similar to FIG. 10 but includes the active sleep bias functionality, in accordance with some embodiments.

FIG. 11 illustrates an embodiment (or circuitry) 1100 of the row based TVC circuit similar to FIG. 10 but includes the active sleep bias functionality, through the SLEEP ENABLE signal. Circuitry 1200 comprises inverters 1101 and 1105, NAND logic gates 1002 and 1106, and 1108, AND gate 1110 with inverted inputs, NOR gates 1103, 1107, and 1109, p-type transistors PWAKE, PPD, PSLP, and PBIAS, and n-type transistor NPD coupled together as shown. In some embodiments, when SLEEP ENABLE is active, only the bit-cells in the selected row group and the selected column receive the TVC write assist on the SRAMVCC. In some embodiments, merely the selected row group is awaken, while all other row groups are kept in the sleep state. This is in contrast with the circuit in FIG. 10 where an entire sector is awaken.

Figure 12:
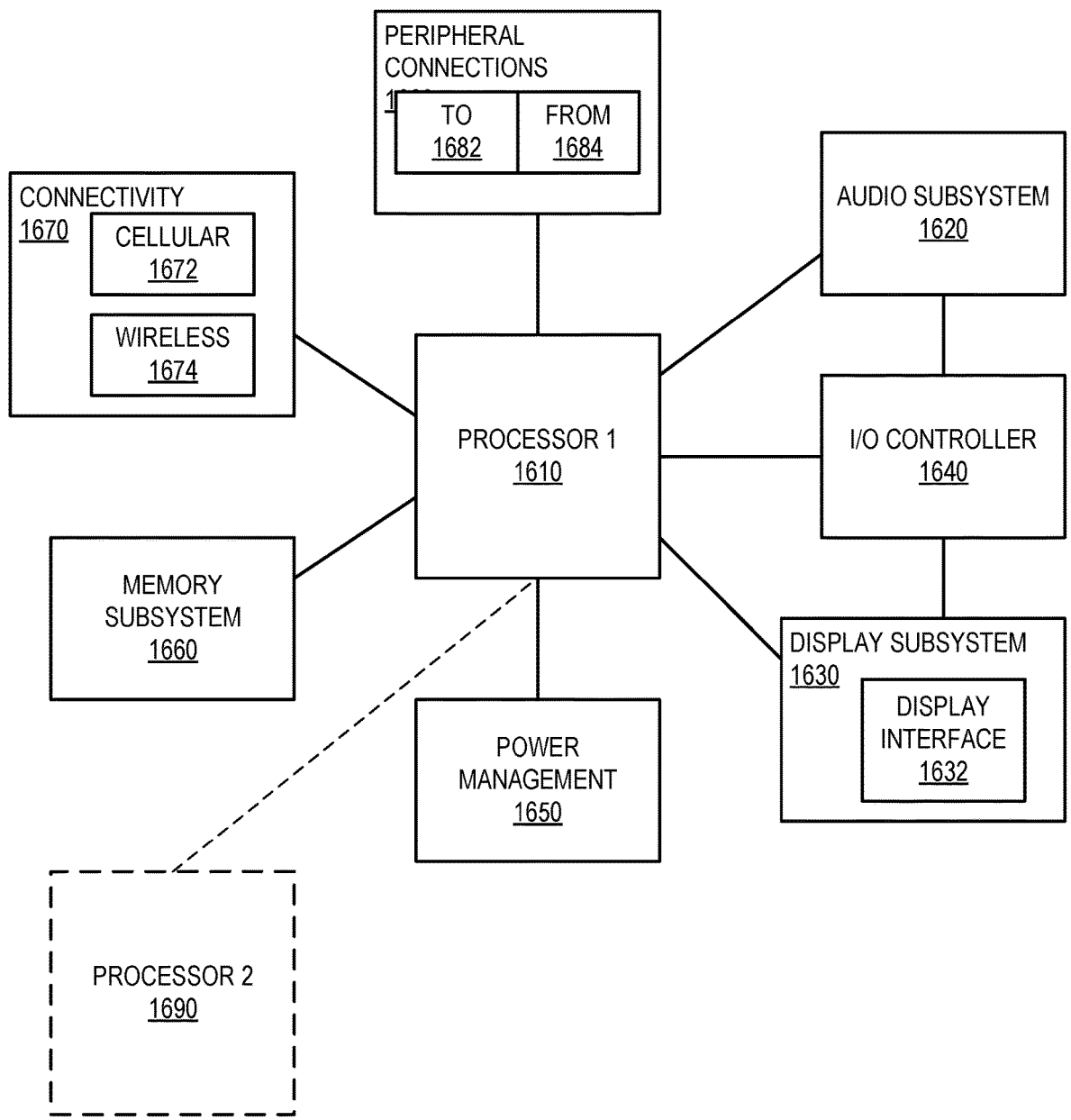
FIG. 12 illustrates a smart device or a computer system or a SoC (System-on-Chip) having the uniform SRAM with row based memory write assist and active sleep bias, according to some embodiments of the disclosure.

FIG. 12 illustrates a smart device or a computer system or a SoC (System-on-Chip) having the uniform SRAM with row based memory write assist and active sleep bias, according to some embodiments of the disclosure. It is pointed out that those elements of FIG. 12 having the same reference numbers (or names) as the elements of any other figure can operate or function in any manner similar to that described, but are not limited to such.

FIG. 12 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 having the uniform SRAM with row based memory write assist and active sleep bias, according to some embodiments discussed. Other blocks of the computing device 1600 may also include uniform SRAM with row based memory write assist and active sleep bias, according to some embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 (and/or processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
   an interconnect comprising a poly extending in a first direction;
   a plurality of power supply rails extending in a second direction, wherein the second direction is parallel to the first direction, wherein the plurality of power supply rails include ground power supply rails; and a memory array organized in rows and columns, wherein the rows are orthogonal to the columns, wherein the first and second directions are parallel to the rows of the memory array, and wherein the memory array comprises bit-cells that are organized such that there are no gap bit-cells in the array.

2. The apparatus of claim 1, wherein the plurality of power supply rails comprises a first power supply rail and a second power supply rail, wherein a first group of the rows share the first power supply rail, and wherein a second group of the rows in the memory array share the second power supply rail separate from the first power supply rail.

3. The apparatus of claim 2, wherein the first power supply rail is to provide a first power supply, wherein the second power supply rail is to provide a second power supply, and wherein the first power supply is controlled separate from the second power supply.

4. The apparatus of claim 2 comprises a write assist circuitry, wherein the write assist circuitry is to control the first power supply separate from the second power supply.

5. The apparatus of claim 4, wherein the write assist circuitry applies on a per row basis or per group of row basis in the memory array.

6. The apparatus of claim 1, wherein the plurality of power supply rails are driven via a multiplexer, wherein the multiplexer is controlled by a row decoding logic, and wherein the row decoding logic is shared with a row decoder.

7. The apparatus of claim 1, wherein the plurality of power supply rails are driven via a multiplexer, and wherein the multiplexer is controlled by column select signals.

8. The apparatus of claim 2 comprises a sleep circuitry to put memory bit-cells of the first group of rows in a sleep state while memory bit-cells of the second group of rows remain in an active state.

9. The apparatus of claim 1, wherein the bit-cells are SRAM bit-cells.

10. The apparatus of claim 1, wherein an individual bit-cell of the bit-cells comprises:
first and second active regions parallel along a first direction of a substrate; and
first, second, third, and fourth gate lines over the first and second active regions, wherein the first, second, third, and fourth gate lines are parallel along a second direction of the substrate, the second direction perpendicular to the first direction.

11. The apparatus of claim 10, wherein:
the first active region is an n-type doped active region, and the second active region is a p-type doped active region; and
the first and second active regions are in first and second silicon fins, respectively.

12. The apparatus of claim 10, wherein all individual ones of the first, second, third, and fourth gate lines are continuous between the first and second active regions.

13. The apparatus of claim 10, wherein individual bit-cell has a length along the first direction of the substrate and a length along the second direction of the substrate, and wherein the first length is greater than the second length.

14. The apparatus of claim 10, wherein individual ones of the first, second, third, and fourth gate lines are spaced apart from one another by trench contact lines parallel along the second direction of the substrate.

15. A system comprising:
a processor;
a memory coupled to the processor, wherein the memory comprises:
an interconnect comprising poly extending in a first direction;
a plurality of power supply rails extending in a second direction, wherein the second direction is parallel to the first direction; and
a memory array organized in rows and columns, wherein the rows are orthogonal to the columns, wherein the first and second directions are parallel to the rows of the memory array, and wherein the memory array comprises bit-cells that are organized such that there are no gap bit-cells in the array; and
a wireless interface to allow the processor to communicate with another device.

16. The apparatus of claim 15, wherein:
the plurality of power supply rails comprises a first power supply rail and a second power supply rail;
a first group of the rows share the first power supply rail;
a second group of the rows in the memory array share the second power supply rail separate from the first power supply rail;
the first power supply rail is to provide a first power supply;
the second power supply rail is to provide a second power supply; and
the first power supply is controlled separate from the second power supply.

17. An apparatus comprising:
a memory comprising four memory sub-arrays, wherein each sub-array comprises a plurality of rows and a plurality of columns of memory bit-cells, and wherein the plurality of rows extend orthogonal to the plurality of columns;
a plurality of power supply lines extending along the plurality of rows of each sub-array, wherein the plurality of power supply lines includes a first power supply line and a second power supply line, wherein the first power supply line provides a first power supply to a first group of rows from the plurality of rows, and wherein the second power supply line provides a second power supply to second group of rows from the plurality of rows; and
circuitry to control the first and second power supplies.

18. The apparatus of claim 17, wherein the each sub-array comprises bit-cells that are organized such that there are no gap bit-cells in the array.

19. The apparatus of claim 17, wherein the plurality of power supply rails are driven via a multiplexer, wherein the multiplexer is controlled by a row decoding logic, and wherein the row decoding logic is shared with a row decoder.

20. The apparatus of claim 17, wherein the plurality of power supply rails are driven via a multiplexer, and wherein the multiplexer is controlled by column select signals.

* * * * *